United States Patent
Maruyama

[19]

[11] Patent Number: 5,973,520
[45] Date of Patent: Oct. 26, 1999

[54] OUTPUT BUFFER CIRCUIT HAVING A VARIABLE OUTPUT IMPEDANCE

[75] Inventor: Shigeru Maruyama, Tokyo, Japan

[73] Assignee: NEC Corporation, Tokyo, Japan

[21] Appl. No.: 09/219,350

[22] Filed: Dec. 23, 1998

[30] Foreign Application Priority Data

Dec. 24, 1997 [JP] Japan ................................. 9-355068

[51] Int. Cl.⁶ .................... H03K 3/00; H03K 19/0175
[52] U.S. Cl. .......................................... 327/108; 326/82
[58] Field of Search ................................. 327/108, 389; 326/82, 83, 87

[56] References Cited

U.S. PATENT DOCUMENTS

| 5,347,177 | 9/1994 | Lipp ........................................ 327/108 |
| 5,410,267 | 4/1995 | Haycock et al. ........................ 326/83 |
| 5,559,447 | 9/1996 | Rees ........................................ 326/87 |
| 5,606,275 | 2/1997 | Farhang et al. ......................... 327/108 |

FOREIGN PATENT DOCUMENTS

| 59-126307 | 7/1984 | Japan . |
| 4-154216 | 5/1992 | Japan . |
| 7-202675 | 8/1995 | Japan . |
| 7-221624 | 8/1995 | Japan . |

*Primary Examiner*—Trong Q. Phan
*Attorney, Agent, or Firm*—Young & Thompson

[57] ABSTRACT

An output buffer circuit includes a pull-up section for connecting therethrough a source line Vcc and an impedance control terminal, a comparator for comparing the potential of the impedance control terminal against a potential of Vcc/2, an UP/DOWN counter for up- and down-counting clock pulses of a clock signal based on the result of the comparison, a D/A converter for converting an output from the UP/DOWN counter, an output section, connected between the source line Vcc and an output terminal, for receiving an input data signal to output an output data signal based on the input data signal. The output from the D/A converter controls both the ON-resistances of the pull-up section and the output section. The output impedance of the output buffer circuit is controlled based on the resistance of an external resistor connected between the impedance control terminal and ground.

8 Claims, 3 Drawing Sheets

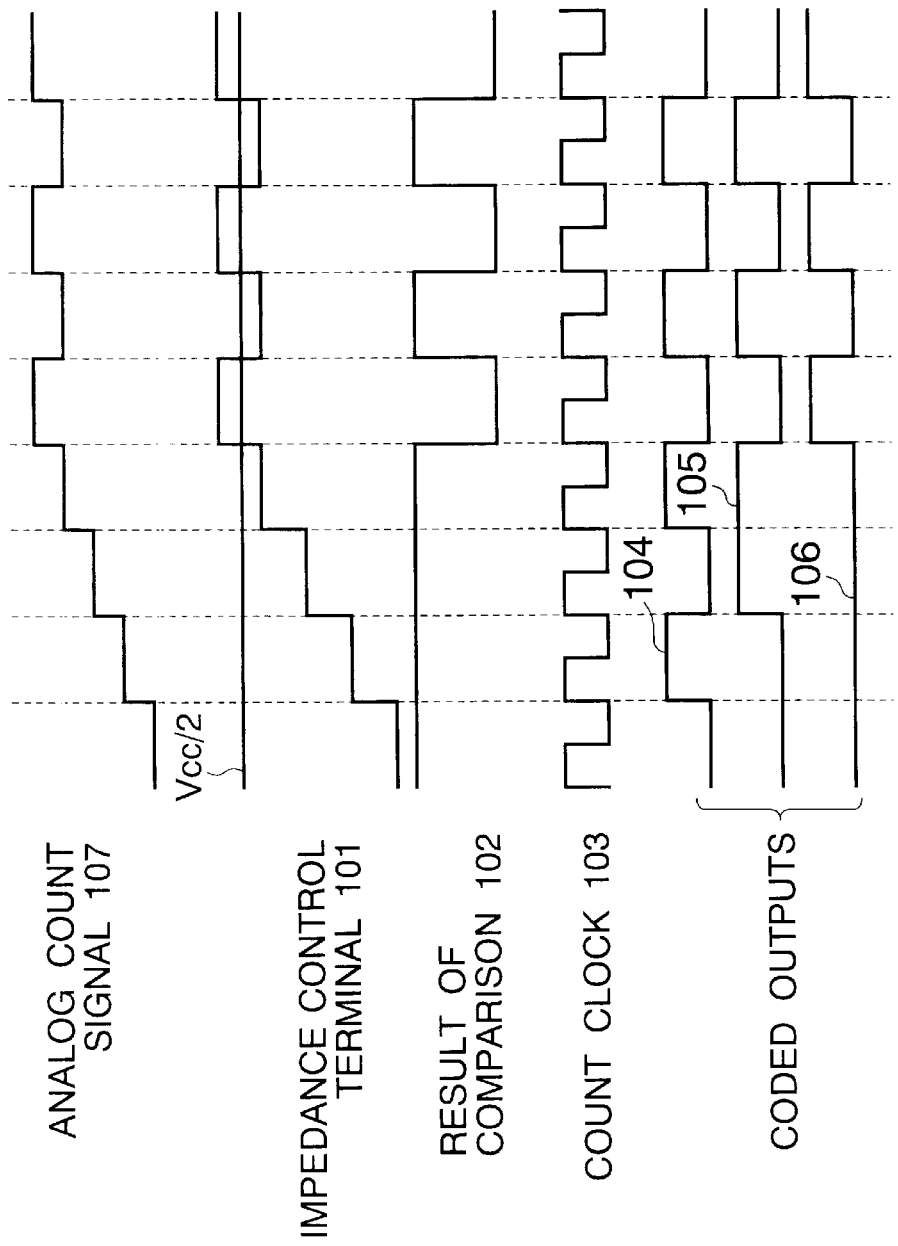

OUTPUT BUFFER CIRCUIT HAVING A VARIABLE OUTPUT IMPEDANCE

BACKGROUND OF THE INVENTION (a) Field of the Invention

The present invention relates to an output buffer circuit having a variable output impedance, and more particularly, to an improvement of such an output buffer circuit to obtain a higher speed with a reduced circuit scale.

(b) Description of the Related Art

In general, it is desired for an output buffer circuit to adapt to a low amplitude signal along with a higher speed of signal transmission. In order for the adaptation, it is necessary to remove or reduce the reflection of the transmitted data signal along the signal transmission line. The removal of the reflection is generally achieved by an impedance matching between the output impedance of the output buffer circuit and the impedance of the signal transmission line connected thereto. The impedance matching can be obtained by an output circuit having a variable output impedance.

FIG. 1 is shows a conventional output buffer circuit having a variable output impedance. The buffer circuit includes an impedance control terminal 21, a pull-up section 26 including parallel nMOS transistors 27 to 29, a comparator 15, UP/DOWN counter 16, a NOR gate array 30 including NOR gates 31 to 33, and an output section 34 including parallel nMOS transistors 35 to 37.

The impedance control terminal 21 is connected to the source line Vcc via the pull-up section 26 and to the ground via an external resistor 14 provided outside the chip of the semiconductor device having the output buffer circuit. The comparator 15 compares the potential of the impedance control terminal 21 against a voltage level of Vcc/2 to deliver a high level or a low level to the UP/DOWN counter 16 based on the result of the comparison. The UP/DOWN counter 16 receives a count clock signal 103 through a clock input terminal 23 and up-counts the clock pulses of the count clock signal if the potential of the impedance control terminal 21 is lower than Vcc/2, and down-counts if the potential of the impedance control terminal 21 is higher than Vcc/2.

The coded outputs 104 to 106 of the UP/DOWN counter 16 are delivered to the respective gates of nMOS transistors 27 to 29 in the pull-up section 26 and to respective first inputs of NOR gates 31 to 33 in the NOR gate array 30. If the potential of the impedance control terminal 21 is lower than Vcc/2, the potential of the impedance control terminal 21 is raised by nMOS transistors 27 to 29 in the pull-up section 26 by increasing the ON-current thereof, whereas if the potential of the impedance control terminal 21 is higher than Vcc/2, the potential of the impedance control terminal 21 is lowered by nMOS transistors 27 to 29. After iterated control, nMOS transistors 27 to 29 in the pull-up section 26 enters into a stable state wherein the overall resistance of nMOS transistors 27 to 29 is substantially equal to the resistance of the external resistor 14. Thus, the impedance control terminal 21 stays substantially at Vcc/2, while being subjected to a slight UP/DOWN control by 1 bit of the coded outputs 104 to 106.

On the other hand, the coded outputs 104 to 106 supplied to the respective first inputs of NOR gates 31 to 33 in the NOR gate array 30 are NORed with a data signal 108 supplied through a data input terminal 14 to the respective second inputs of NOR gates 31 to 33. The NORed data are supplied to respective gates of nMOS transistors 35 to 37 in the output section 34, and control the ON-resistances of nMOS transistors 35 to 37 in the output section 36 similarly to the ON-resistances of nMOS transistors 27 to 29 in the pull-up section 26. After the pull-up section 26 enters into the stable state, so long as the data signal 108 supplied through the data input terminal 24 is at a L-level, the output impedance at the output terminal 25 of the output buffer circuit is determined by the overall ON-resistance of nMOS transistors 35 to 37, which is determined by the overall ON-resistance of transistors 25 to 27 and the ratio of the overall transistor size of nMOS transistors 27 to 29 to the overall transistor size of nMOS transistors 37 to 39. Thus, it is possible to control the output impedance at the output terminal 25 based on resistance of the external resistor 14 during transmission of a high level signal. The resistance of the external resistor 14 can be selected at any value from outside to remove the signal reflection.

In the conventional output buffer circuit, the data input terminal 24 for receiving the data signal 108 has a large parasitic capacitance because of the plurality of NOR gates 31 to 33 connected to the data input terminal 24, which impedes a high speed signal transmission.

In addition, the number of nMOS transistors 27 to 29 in the pull-up section 26 and the number of nMOS transistors 35 to 37 in the output section 34 are large, which raise the circuit scale of the output buffer circuit.

SUMMARY OF THE INVENTION

It is therefore an object of the present invention to manufacture an output buffer circuit having a variable output impedance, with a reduced circuit scale and with a high speed signal transmission.

The present invention provides an output buffer circuit comprising an impedance control terminal, a pull-up section, connected between the impedance control terminal and a source line, for controlling a potential of the impedance control terminal, a comparator for comparing the potential of the impedance control terminal against a reference potential to output a comparison result signal, an impedance control section for receiving the comparison result signal to output an analog control signal based on the potential of the impedance control terminal, an output section, connected between the source line and an output terminal, for receiving an input data signal to couple the output terminal to the source line thereby outputting an output data signal based on the input data signal, the analog control signal controlling both impedances of the pull-up section and the output section.

In accordance with the output buffer circuit of the present invention, the analog control signal supplied from the impedance control section reduces the circuit scales of the pull-up section and the output section and also reduces the parasitic capacitance of the data input terminal compared to the conventional output buffer circuit, thereby increasing signal transmission speed.

The above and other objects, features and advantages of the present invention will be more apparent from the following description, referring to the accompanying drawings.

BRIEF DESCRIPTION OF DRAWINGS

FIG. 3 is a timing chart of the output buffer circuit of FIG. 2.

PREFERRED EMBODIMENT OF THE INVENTION

Figure 1:
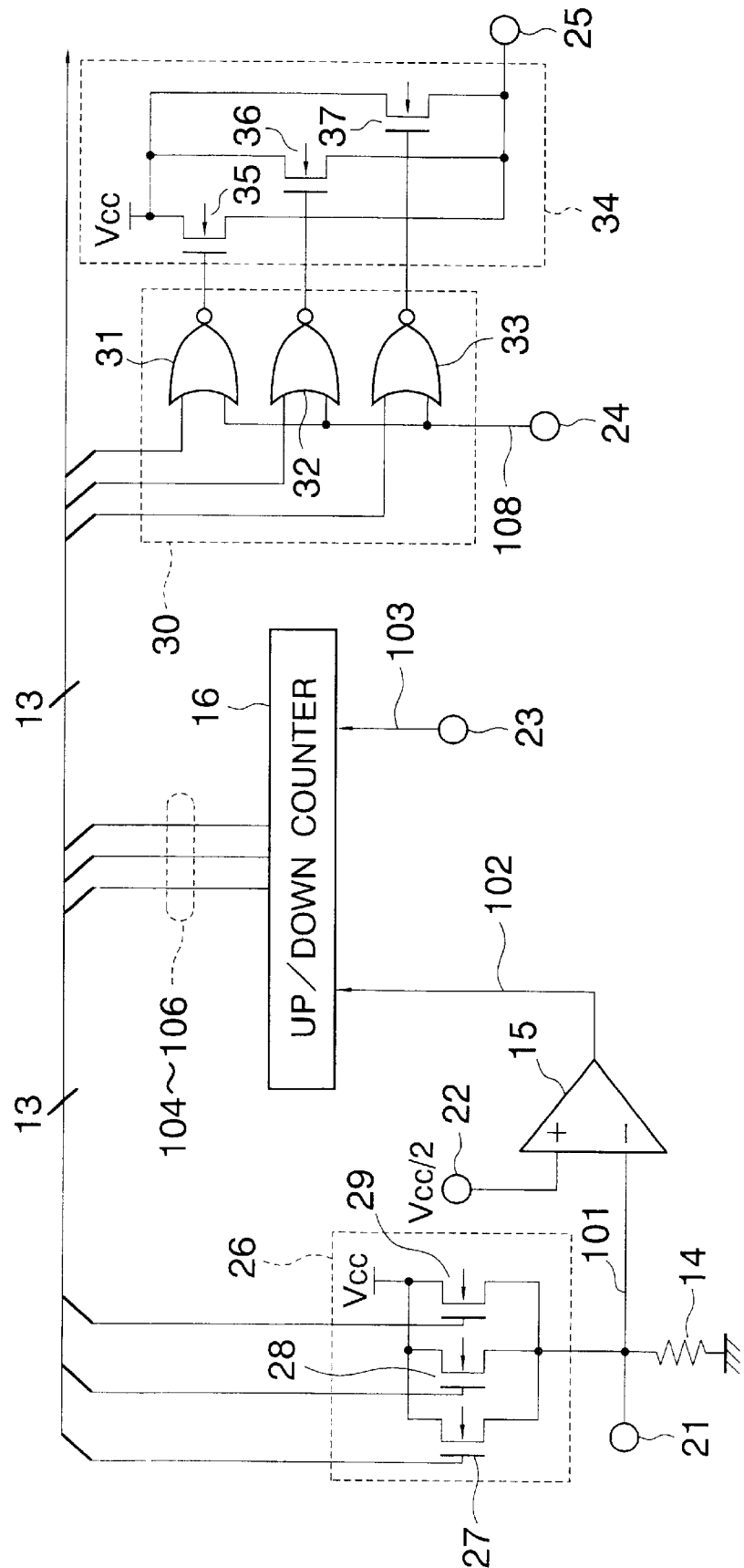
FIG. 1 is a block diagram of a conventional output buffer circuit.

Now, the present invention is more specifically described with reference to accompanying drawings, wherein similar constituent elements are designated by similar reference numerals throughout the drawings.

Figure 2:
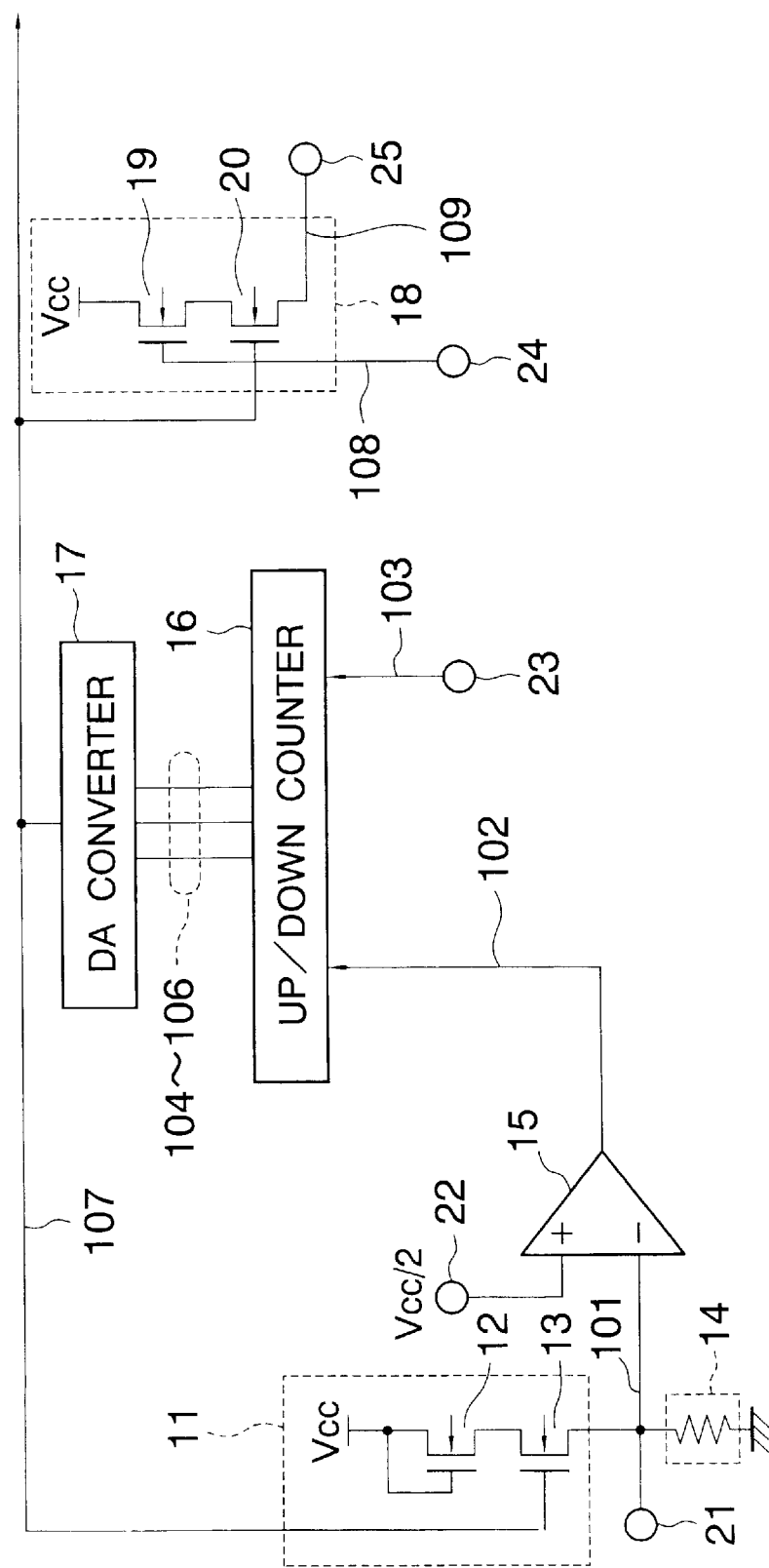
FIG. 2 is a block diagram of an output buffer circuit according to an embodiment of the present invention.

Referring to FIG. 2, an output buffer circuit according to an embodiment of the present invention has a pull-up section 11, a comparator 15, an impedance control section including an UP/DOWN counter 16 and a D/A converter 17, and an output section 18.

The pull-up section 11 has a pair of nMOS transistors 12 and 13 connected in series between a source line Vcc and an impedance control terminal 21. An external resistor 14 is connected between the impedance control terminal 21 and the ground, outside the chip of the semiconductor device including the output buffer circuit. The comparator 15 compares a reference voltage of Vcc/2 input to the non-inverting input of the comparator 15 against the potential of the impedance control terminal 21 connected to the inverting input of the comparator 15, to output a result signal 102 representing the result of the comparison by the comparator 15. The UP/DOWN counter 16 receives the comparison result signal 102 and a count clock signal 103 supplied through a clock input terminal 23, and counts the clock pulses of the count clock signal 103 in up/down directions based on the results of the comparison by the comparator 15.

The D/A converter 17 converts the output codes 104 to 106 of the UP/DOWN counter 16 to deliver an analog control signal 107. The nMOS transistor 13 in the pull-up section 11 receives the analog control signal 107, whereas the gate of the nMOS transistor 12 is connected to the drain of the nMOS transistor 12 to implement an active resistor. The output section 18 includes a pair of nMOS transistors 19 and 20 connected in series between the source line Vcc and the output terminal 25 of the output buffer circuit. The nMOS transistor 20 in the output section 18 receives the analog control signal 107 at the gate thereof, is whereas the nMOS transistor 19 receives, at the gate thereof, an input data signal 24 input through the data input terminal 24. In the present embodiment, the gate width W12, W13, W19 and W20 of the respective nMOS transistors 12, 13, 19 and 20 are designed so that W13:W12=W20:W19. The high level of the input data signal 108 is equal to Vcc.

Referring to FIG. 3 showing a timing chart of the output buffer circuit of FIG. 2, the potential 101 of the impedance control terminal 21 is compared against the reference potential Vcc/2 in the comparator 15, which outputs a high level during the initial time interval when the potential 101 is lower than Vcc/2. The UP/DOWN counter 16 up-counts the clock pulses of the count clock signal 103 based on the high level of the output 102 of the comparator 15. The coded outputs 104 to 106 of the UP/DOWN counter 16 is converted in the D/A converter 17 into an analog control signal 107.

The analog control signal 107, input to the gate of nMOS transistor 13 in the pull-up section 11, raises the ON-current of nMOS transistor 13, thereby raising the potential 101 of the impedance control terminal 21 in proportion to the rise of the analog control signal 107. After the potential 101 of the impedance control terminal 21 becomes higher than Vcc/2, the comparator 15 delivers a low level signal, based on which the UP/DOWN counter 16 down-counts one clock puse of the count clock signal, which lowers the analog control signal 107 by an amount corresponding to one bit of the coded data from the UP/DOWN counter 16. The nMOS transistor 13 then decreases the ON-current thereof, lowering the potential 101 of the impedance control terminal 21, which in turn inverses the output of the comparator 15. Thus, the potential 101 of the impedance control terminal 21 stays substantially at Vcc/2 while iterating alternate rises and falls of the potential by an amount corresponding to one bit of the coded count data of the UP/DOWN counter 16.

In this state, the output buffer circuit stays in a stable state wherein the analog control signal 107 also iterates alternate rises and falls corresponding to one bit of the UP/DOWN counter 16, and wherein the overall ON-resistance of the pull-up section 11 is substantially equal to the resistance of the external resistor 14, which is connected outside the chip of the semiconductor device including the output buffer circuit. In addition, the analog control signal 107 raises/lowers the ON-current of the nMOS transistor 20 so long as the input data signal 108 received by the gate of the nMOS transistor 19 is at a high level.

The configuration wherein W13:W12=W20:W19 provides an equal potential between the gates of nMOS transistors 13 and 20, an equal potential between the sources of nMOS transistors 13 and 20 and an equal potential between the drains of the nMOS transistors 13 and 20, after the potential 101 of the impedance control terminal 21 stays substantially at Vcc/2. In this state, the output impedance Z at the output terminal 25 of the output buffer circuit is represented by:

$$Z=R14 \times W13/W20,$$

wherein R14 is the resistance of the external resistor 14.

Thus, the output impedance Z can be adjusted or selected based on the selection of the resistance R14 of the external resistor 14. The output buffer circuit of the present embodiment has a simpler configuration in the pull-up section 11 and the output section 18 compared to the conventional output buffer circuit of FIG. 1. In addition, the data input terminal 24 is connected only to the gate of nMOS transistor 19, a smaller parasitic capacitance can be obtained, which raises the signal transmission speed.

Since the above embodiments are described only for examples, the present invention is not limited to the above embodiments and various modifications or alterations can be easily made therefrom by those skilled in the art without departing from the scope of the present invention.

What is claimed is:

1. An output buffer circuit comprising an impedance control terminal, a pull-up section, connected between said impedance control terminal and a source line, for controlling a potential of said impedance control terminal, a comparator for comparing the potential of said impedance control terminal against a reference potential to output a comparison result signal, an impedance control section for receiving said comparison result signal to output an analog control signal based on the potential of said impedance control terminal, an output section, connected between said source line and an output terminal, for receiving an input data signal to couple said output terminal to said source line thereby outputting an output data signal based on said input data signal, said analog control signal controlling both ON-resistances of said pull-up section and said output section.

2. The output buffer circuit as defined in claim 1, wherein said reference potential is half a potential of said source line.

3. The output buffer circuit as defined in claim 1, wherein said impedance control section comprises an UP/DOWN counter for counting clock pulses of a count clock signal based the comparison result signal and a D/A converter for converting a count by said UP/DOWN counter.

4. The output buffer circuit as defined in claim 3, wherein said UP/DOWN counter up-counts the clock pauses of said count clock signal when the potential of said impedance control terminal is lower than said reference potential and down-counts the clock pulses of said count clock signal when the potential of said external control terminal is higher than said reference potential.

5. The output buffer circuit as defined in claim 1, further comprising an external resistor connected between said impedance control terminal and a second source line.

6. The output buffer circuit as defined in claim 1, wherein said pull-up section comprises first and second transistors connected in series, said first transistor having a gate connected to a source thereof for implementing an active resistor, said second transistor having a gate for receiving said analog control signal.

7. The output buffer circuit as defined in claim 6, wherein said output section comprises third and fourth transistors connected in series, said third transistor having a gate for receiving said input data signal, said fourth transistor having a gate for receiving the analog control signal.

8. The output buffer circuit as defined in claim 7, wherein said first through forth transistors have respective gate widths W1, W2, W3, W4 having a relationship of W2:W1= W4:W3.

* * * * *